United States Patent
Litzinger et al.

(10) Patent No.: US 11,927,643 B2
(45) Date of Patent: Mar. 12, 2024

(54) METHOD, DEVICE AND SYSTEM FOR RECOGNIZING AN ELECTRICAL OSCILLATION IN AN ELECTRICAL POWER SUPPLY SYSTEM

(71) Applicant: Siemens Aktiengesellschaft, Munich (DE)

(72) Inventors: Andreas Litzinger, Fuerth (DE); Stefan Piel, Essen (DE); Reinhold Voigt, Reichenschwand (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/496,966

(22) Filed: Oct. 8, 2021

(65) Prior Publication Data
US 2022/0113358 A1    Apr. 14, 2022

(30) Foreign Application Priority Data
Oct. 8, 2020   (EP) .................................... 20200786

(51) Int. Cl.
| | |
|---|---|
| G01R 31/42 | (2006.01) |
| G01R 25/00 | (2006.01) |
| G06F 1/28 | (2006.01) |

(52) U.S. Cl.
CPC ............. G01R 31/42 (2013.01); G01R 25/00 (2013.01); G06F 1/28 (2013.01)

(58) Field of Classification Search
CPC .... G01R 31/42; G01R 25/00; G01R 19/2513; G01R 29/02; G06F 1/28; H02J 3/24
See application file for complete search history.

(56) References Cited

U.S. PATENT DOCUMENTS

| | | | | |
|---|---|---|---|---|
| 8,060,259 B2 * | 11/2011 | Budhraja | ................ | H02J 3/003 709/224 |
| 10,054,620 B2 * | 8/2018 | Piel | ........................ | G01R 21/00 |

(Continued)

FOREIGN PATENT DOCUMENTS

| | | | | |
|---|---|---|---|---|
| CA | 2802633 A1 * | 7/2013 | ............. | G01D 5/353 |
| CN | 106934124 B * | 2/2020 | ................ | G01P 3/00 |

(Continued)

OTHER PUBLICATIONS

Liu et al. "A Rate and Resource Detection Based Receive Buffer Adaptation Approach for High-speed Data Transportation", IEEE Proceedings of 19th International Conference on Computer Communications and Networks (pp. 1-6, Aug. 2010 (Year: 2010 ).*

Primary Examiner — Alexander Satanovsky
Assistant Examiner — Asm Fakhruddin
(74) Attorney, Agent, or Firm — Laurence A. Greenberg; Werner H. Stemer; Ralph E. Locher

(57) ABSTRACT

A method for recognizing an electrical oscillation in an electrical power supply system, in which an electrical oscillation variable is determined for at least one measuring point in the power supply system. Parameters of an electrical oscillation are calculated on the basis of a time curve of the oscillation variable for the at least one measuring point, and the presence and type of an electrical oscillation is deduced using the parameters. To be able to provide correct parameters for assessing the oscillation in a timely fashion after the start of the oscillation, it is proposed that the number of those successive values of the oscillation variable from which the parameters of the electrical oscillation are calculated is adapted dynamically to the sequence of values of the oscillation variable.

10 Claims, 6 Drawing Sheets

(56) References Cited

U.S. PATENT DOCUMENTS

| | | | |
|---|---|---|---|
| 10,684,617 B2 | 6/2020 | Bechstedt et al. | |
| 2004/0172207 A1* | 9/2004 | Hancock | G01R 19/2513 |
| | | | 702/60 |
| 2012/0232820 A1 | 9/2012 | Wilson | |
| 2013/0204557 A1* | 8/2013 | Trudnowski | H02J 13/00002 |
| | | | 702/60 |
| 2014/0350873 A1* | 11/2014 | Litzinger | H02J 3/242 |
| | | | 702/60 |

FOREIGN PATENT DOCUMENTS

| | | | | |
|---|---|---|---|---|
| EP | 2774242 B1 | 3/2016 | | |
| EP | 3252482 A1 * | 12/2017 | | G01R 19/2513 |
| EP | 3252482 A1 | 12/2017 | | |
| ES | 2698385 T3 | 2/2019 | | |
| WO | WO 2013087122 A1 | 6/2013 | | |
| WO | WO 2014056531 A2 | 4/2014 | | |
| WO | WO 2015180766 A1 | 12/2015 | | |

\* cited by examiner

METHOD, DEVICE AND SYSTEM FOR RECOGNIZING AN ELECTRICAL OSCILLATION IN AN ELECTRICAL POWER SUPPLY SYSTEM

CROSS-REFERENCE TO RELATED APPLICATION

This application claims the priority, under 35 U.S.C. § 119, of European Patent Application EP 20200786.0, filed Oct. 8, 2020; the prior application is herewith incorporated by reference in its entirety.

FIELD AND BACKGROUND OF THE INVENTION

The invention relates to a method for recognizing an electrical oscillation in an electrical power supply system, in which an electrical oscillation variable is determined for at least one measuring point in the power supply system. Parameters of an electrical oscillation are calculated on the basis of a time curve of the oscillation variable for the at least one measuring point, and the presence and type of an electrical oscillation is deduced using the parameters. The invention also relates to a device and a system for recognizing an electrical oscillation.

To ensure a smooth and reliable operation of electrical power supply systems, measurement values of the electrical power supply system that are characteristic for the system state are monitored in so-called power system control centers in order to ascertain whether the power supply system is in its intended operational state or else in a critical state. To this end, measurement values of electrical measured variables, such as for example current, voltage and power, are captured at selected measuring points of the electrical power supply system by means of suitable transducers and are supplied, usually in digital form, to the power system control center for evaluation and observation purposes. To ensure a temporal reference of the individual measurement values to one another, the recorded measurement values are usually complemented by so-called timestamps, i.e., time information data, which specify, for example, the time at which the measurement values were captured.

So-called "electrical oscillations" (also simply referred to as "oscillations" below) represent one form of a critical operational state of an electrical power supply system. Such oscillations arise, for example, in the case of sudden load changes or changes in the structure of the electrical power supply system (for example, by connecting or disconnecting relatively large system parts). In this case, the generators at the feeding points of the electrical power supply system must adjust to the new load situation. This is usually implemented in the form of a damped oscillation with a frequency of up to a few hertz, until the new work point of the electrical power supply system has been stabilized. Oscillating current and voltage states are generated in the power supply system as a result of the transient behavior of the generators and the states can have different effects on the power supply system and its electrical components (e.g., lines, cables, transformers). While damped, quickly decaying oscillations with comparatively low amplitudes can be accepted in the power supply system, weakly damped or even escalating oscillations in particular represent a very critical state of the power supply system which can easily lead to outages and disconnections of relatively large system portions. Moreover, the volatile system structure as a result of outages of individual system portions can result in an overload of still functional portions of the electrical power supply system, which may lead to cascading disconnections up to a so-called blackout. Therefore, in particular those oscillations, which should be classified as critical, should be signaled without delay to the control center staff of the electrical power supply system.

To this end, measurement values are captured as complex current or voltage phasors using so-called phasor measuring devices or "phasor measurement units" (PMUs), for example, which comprise a statement about the amplitude and phase angle of the measured variable to be measured at the respective measuring point of the electrical power supply system. Such phasor measurement values are captured at high sampling rates, for example in order to be able to recognize load flows and possible oscillations even more accurately and optionally introduce suitable countermeasures for averting impending unstable states. An exemplary method that can be used to deduce the presence of oscillations in a power supply system on the basis of phasor measurement values is known from the European patent EP 2774242 B1 (corresponding to U.S. patent publication No. 2014/0350873).

If oscillations in electrical power supply systems cannot be controlled, they may lead to significant disruptions in the electrical operational equipment, up to the total outage of the entire system regions. A timely recognition of such phenomena with specification of reliable characteristics (parameters) for the assessment thereof is therefore of great importance to guaranteeing the electrical power supply. This applies, in particular, if automated switching measures for removing such oscillation events are intended in order to avoid far-reaching disruptions.

There are a multiplicity of different approaches for recognizing and assessing oscillations. By way of example, parameters of a possible oscillation are ascertained using successive values of an oscillation variable, e.g., an active power, and the presence and optionally the type of oscillation are deduced therefrom. In particular, the type of oscillation is considered to refer to a statement as to whether this is a damped or an undamped oscillation. A disadvantage of the known methods is that they operate with a fixed number of values of the oscillation variable that should be used for the calculation of the parameters. Consequently, those values determined under the influence of the oscillation blend with those values determined during an undisturbed phase of the system operation, particularly at the start of an oscillation. As a result, errors may occur when calculating the parameters. If such incorrectly calculated parameters are used to determine control actions (e.g., connecting or disconnecting certain system regions) for the electrical power supply system, this may result in damaging effects on the power supply system. In particular, this may occur if an actually innocuous damped oscillation is recognized as an undamped oscillation as a result of parameters calculated incorrectly at the start of the oscillation and unnecessary countermeasures are subsequently introduced and destabilize the power supply system.

In this context, it is assumed by way of example that a determination of the oscillation variable at the measuring point is regularly updated and the number of values of the oscillation variable used for calculating the parameters of the oscillation reproduces the curve of the oscillation variable over the last forty seconds. In such a case, the values not affected by the oscillation will dominate the results of the calculation of the parameters over a comparatively long period of time, and so the calculated parameters are incorrect.

SUMMARY OF THE INVENTION

The invention is therefore based on the object of providing correct parameters for assessing the oscillation in a timely fashion after the start of an oscillation.

This object is achieved by a method of the type set forth at the outset, in which the number of those successive values of the oscillation variable from which the parameters of the electrical oscillation are calculated is adapted dynamically to the sequence of values of the oscillation variable.

In contrast to the known approach, according to the invention, the number of values of the oscillation variable used to calculate the parameters is consequently chosen in variable fashion, with the number arising dynamically from the curve of the oscillation variable. When calculating the parameters, this can avoid the use of a multiplicity of values that were not determined during the oscillation and therefore falsify the result of the parameter calculation. Consequently, correct parameters for recognizing and assessing an oscillation can be provided comparatively quicker than previously, and so optionally required countermeasures for stabilizing the system can be introduced at a correspondingly earlier time.

Specifically, provision can be made, for example, for an electrical active power or a variable proportional to the electrical active power to be used as oscillation variable. A variable proportional to the electrical active power can be, for example, a difference of the phase angles of two voltage phasors measured at different points for small angle differences in the active power which is transported between the measuring points. However, in principle use can be made of any electrical variable that is proportional to the electrical active power.

According to an advantageous embodiment of the method according to the invention, provision can be made, for example, for the values of the oscillation variable to be written to a data buffer which is operated as a circular buffer.

In this context, circular buffer operation is considered to be the procedure when storing data in a memory, in which a respective newest stored value replaces the respective oldest value in the memory.

Specifically, provision can be made in this context for the length of a data window which defines what values of the oscillation variable contained in the data buffer are used to calculate the parameters to be dynamically adapted to the sequence of values of the oscillation variable.

In this case, use is made of a data buffer with a constant storage size. In this embodiment, a dynamic selection of the values of the oscillation variable to be used for the calculation of the parameters is implemented by adapting the length of a data window. Consequently, the length of the data window is influenced in this case while the size of the data buffer remains unchanged.

Alternatively, provision can also be made for the size of the data buffer to be adapted dynamically to the sequence of values of the oscillation variable.

In this case, use is made of a data buffer whose storage area utilizable for storing the values of the oscillation variable can be adapted dynamically. Hence, as it were, the size of the data buffer itself is influenced.

A further advantageous embodiment of the method according to the invention provides for the start of an electrical oscillation to be recognized and for those values of the oscillation variable determined after the start of the electrical oscillation to be used to calculate the parameters of the electrical oscillation.

This can ensure that the calculation of the parameters is at least predominantly based on those values that were determined during the oscillation. By way of example, the start of the oscillation can be implemented by monitoring for a jump, in which a jump-like change that exceeds a threshold is recognized in the sequence of successive values of the oscillation variable.

A further advantageous embodiment of the method according to the invention provides for the values of the oscillation variable to be transformed into the frequency domain for the purposes of calculating the parameters.

The values of the oscillation variable are usually determined in the time domain. A transformation into the frequency domain allows individual oscillations to be recognized and assessed with their characteristic oscillation frequencies ("oscillation modes" or "modes"). By way of example, a transformation into the frequency domain can be implemented by means of a Fast Fourier Transform (FFT).

By way of example, the number of the values used to calculate the parameters can be adapted continuously. However, it was found to be particularly advantageous to alter the number in fixed steps (increments). By way of example, provision can be made here for the number of values of the oscillation variable used to calculate the parameters to correspond to a power of two $2^N$, where N should be chosen from the range of natural numbers greater than or equal to 3. This lends itself in particular if a transformation of the values into the frequency domain is implemented by means of an FFT.

According to a further advantageous embodiment of the method according to the invention, provision can moreover be made for an amplitude and a damping of the electrical oscillation to be calculated as parameters of the electrical oscillation.

These characteristics are particularly well suited to characterizing the behavior and the risk potential of an oscillation. High amplitudes and low or even negative damping indicate an oscillation with a significant risk potential. By way of example, the "amplitude" and "damping" parameters may be calculated as described in the aforementioned EP 2774242 B1.

A further advantageous embodiment of the method according to the invention provides for the calculated parameters to be displayed on a display apparatus of a data processing device that monitors the power supply system.

By way of example, such a data processing device can be part of a power system control center, where information about the operational state of the power supply system including oscillations possibly present is displayed to the operators of the power supply system.

According to a further advantageous embodiment of the method according to the invention, provision can further be made for a warning signal to be generated in the case where the calculated parameters indicate an only weakly damped or even a completely undamped (both are referred to as "undamped") electrical oscillation. In an enhanced embodiment, the output or queuing of the warning signal is moreover dependent on the amplitude of the oscillation present at the respective time.

Specifically, provision can ultimately be made in this context for a countermeasure suitable for damping an electrical oscillation to be triggered if a warning signal is present.

By way of example, suitable damping measures can be the control of switching devices for connecting or disconnecting certain system parts, generators and/or loads. Additionally, mains filters or capacitances or inductances, for example, can be connected to the system in order to bring about damping.

The aforementioned object is also achieved by a device for recognizing an electrical oscillation in an electrical power supply system, containing a computing device. In this case, the computing device is set up to determine an electrical oscillation variable for at least one measuring point in the power supply system, to calculate parameters of an electrical oscillation on the basis of a time curve of the oscillation variable for the at least one measuring point, and to deduce the presence and type of an electrical oscillation using the parameters.

In this case, provision is made according to the invention for the computing device to be set up to dynamically adapt the number of those successive values of the oscillation variable from which the parameters of the electrical oscillation are calculated to the sequence of values of the oscillation variable.

All of the statements made above and below regarding the method according to the invention accordingly hold true with respect to the device according to the invention and vice versa; in particular, the device according to the invention is designed to perform the method according to the invention in any desired embodiment or a combination of desired embodiments. With respect to the advantages of the device according to the invention, reference is also made to the advantages described regarding the method according to the invention.

Finally, the aforementioned object is also achieved by a system for recognizing an electrical oscillation in an electrical power supply system. In this case, the system contains at least one device according to the invention as described above, wherein the at least one device is embodied to determine parameters of the electrical oscillation for at least two measuring points in the electrical power supply system on the basis of a method according to any one of the above-described embodiments.

Such a system is generally also referred to as a wide area monitoring system (WAMS). If options for automatic interventions in the system operation by way of corresponding automated control instructions are also possible, the system can also be referred to as WAMPC ("wide area monitoring, protection and control"). Both variants should be considered to be a wide area monitoring system in the following text.

Other features which are considered as characteristic for the invention are set forth in the appended claims.

Although the invention is illustrated and described herein as embodied in a method, a device and a system for recognizing an electrical oscillation in an electrical power supply system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
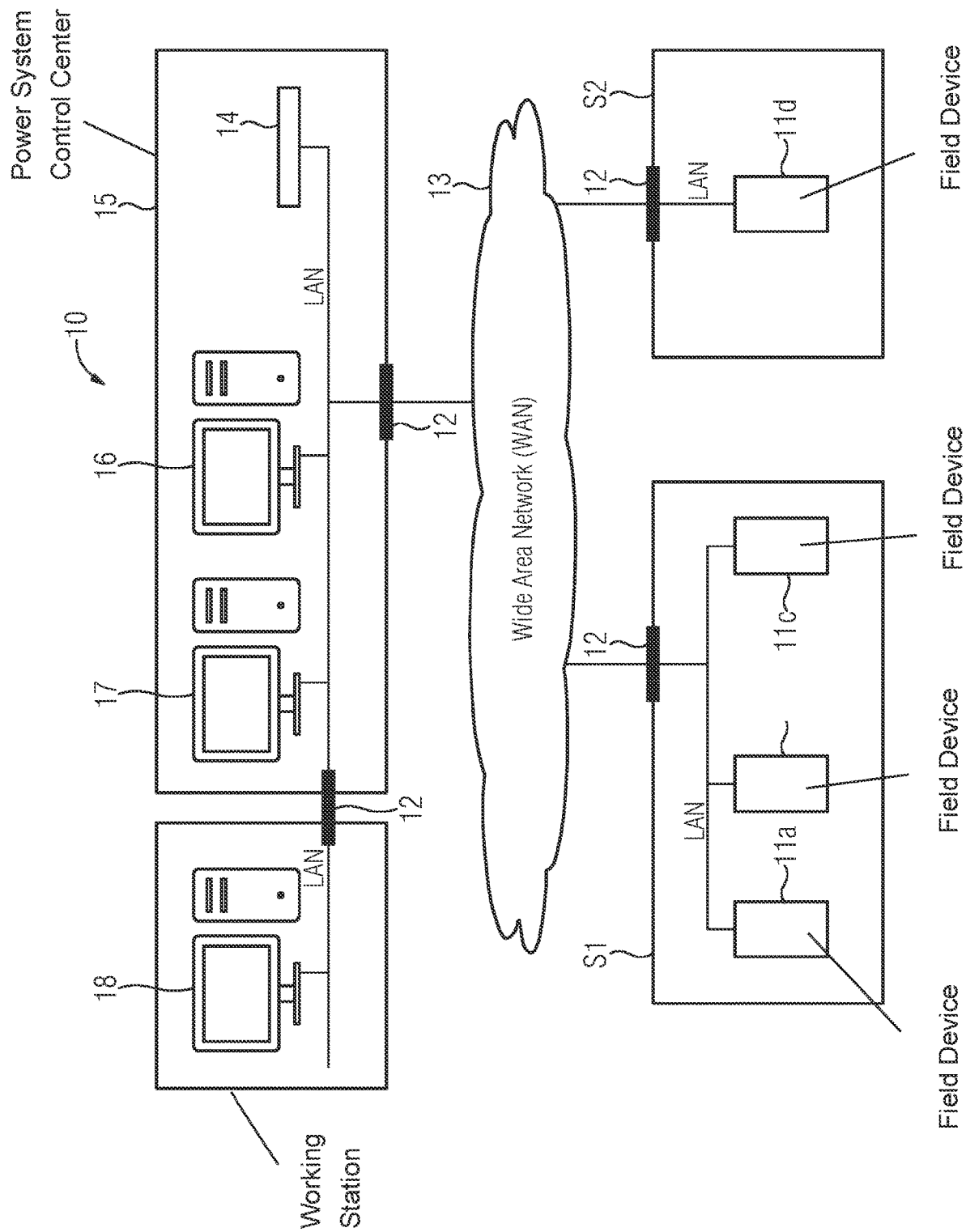
FIG. 1 is a schematic representation of an example of a wide area monitoring system.

Referring now to the figures of the drawings in detail and first, particularly to FIG. 1 thereof, there is shown a schematic view of an example of a wide area monitoring system 10 for monitoring an operation of an electrical power supply system, which has not been shown in FIG. 1 for reasons of clarity.

The wide area monitoring system 10 contains field devices 11a-d which are arranged on the level of the power supply system and which are used to ascertain values of an electrical oscillation variable at the respective measuring point by measuring suitable electrical measured variables, such as, e.g., current and voltage, at a plurality of measuring points of the power supply system. By way of example, an electrical active power or a phase angle difference of voltage phasors recorded at two measuring points can be used as oscillation variable. Below, an electrical active power is assumed as oscillation variable by way of example.

It is assumed by way of example that the field devices 11a-c are arranged in the region of a first substation S1 while the field device 11d is arranged in the region of a second substation S2. Naturally, other topologies are also conceivable, and so the arrangement and split shown here should be understood to be merely exemplary.

By way of example, the field devices 11a-d can be so-called phasor measuring devices ("phasor measurement units"), which are set up to capture phasors of the respective measured variable (e.g., current phasor, voltage phasor) and provide the latter with an accurate timestamp. Such phasor measurement values each comprise the specification of an amplitude and of a phase angle of the respective measured variable.

The field devices 11a-e are connected via local networks ("LANs"), corresponding routers or gateways 12 and a wide area network 13 ("WAN") to a device 14 for recognizing an electrical oscillation in the power supply system. By way of example, the latter can be part of a power system control center 15. Moreover, an engineering station 16 for configuring the device 14 and an operator station 17 (operator working station) can also be connected via a local network of the power system control center 15 to the device 14 for recognizing the oscillation and can be used to access the device 14 and display results of calculations performed by the device 14. Moreover, further operator working stations 18 can facilitate access to the device 14, even from outside of the power system control center 15.

Figure 2:
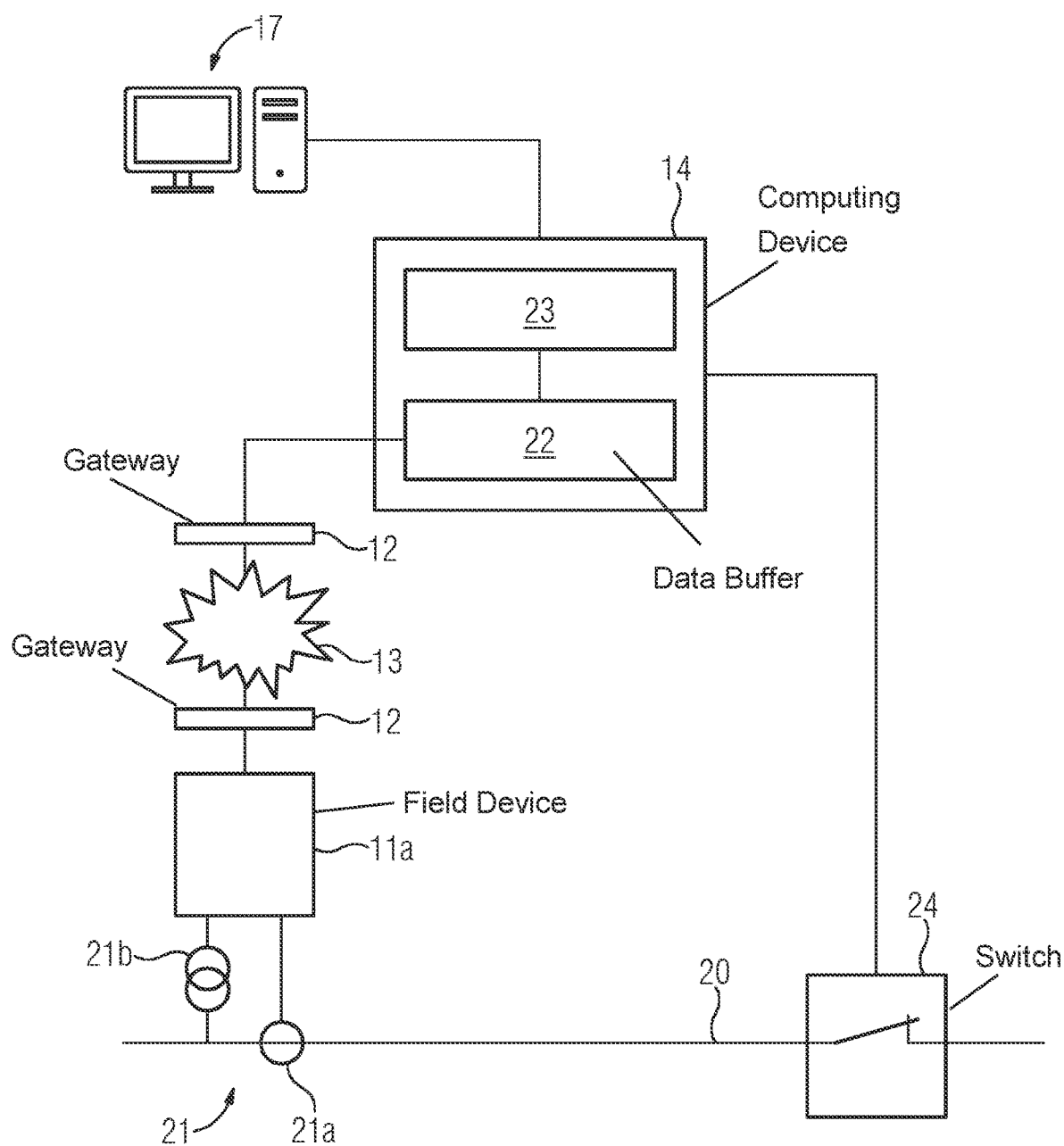
FIG. 2 is a schematic representation of a portion of the system of FIG. 1 containing a device for recognizing and assessing an electrical oscillation.

The procedure for recognizing an oscillation should be explained below on the basis of FIGS. 2 to 6. To this end, FIG. 2 shows a portion of the wide area monitoring system 10 of FIG. 1. In this case, components that correspond to one another are labeled with identical reference signs.

FIG. 2 shows a line 20 of a power supply system otherwise not illustrated in any more detail. At a measuring point 21, signals of electrical measured variables (in this case: current and voltage) are captured using appropriate sensors, which are indicated here purely by way of example as inductive current transducer 21a and voltage transducer 21b, and are supplied to the field device 11a. Using the field device 11a, the captured signals are converted into digital measurement values and are provided with a precise timestamp. Thereupon, active power values can be calculated in the field device 11a from measurement values belonging to one another and the active power values are subsequently transmitted via gateways/routers 12 and the network 13 to the device 14 for recognizing an oscillation. Alternatively, the timestamped measurement values can also be transmitted directly to the device 14. In this case, the active power values are only calculated in the device 14.

In addition to the field device 11a, further field devices can be present at further measuring points—as shown in FIG. 1—and can be used to capture measurement values suitable for determining the active power.

The active power values are written to a data buffer 22 of the device 14 in accordance with their temporal sequence. In this case, the data buffer 22 is operated as a circular buffer, i.e., the respective oldest active power value present in the data buffer 22 is deleted for each newly added active power value. By way of example, the memory capacity of such a data buffer 22 can be such that a time duration of 40 s can be mapped to the data buffer. By way of example, values of the oscillation variable can be captured and written to the data buffer with a sampling rate of 50 values per second.

A computing device 23 of the device 14 is used to calculate, from the active power values present in the data buffer 22, parameters which can be used as characteristics for characterizing an oscillation in the power supply system.

Figure 3:
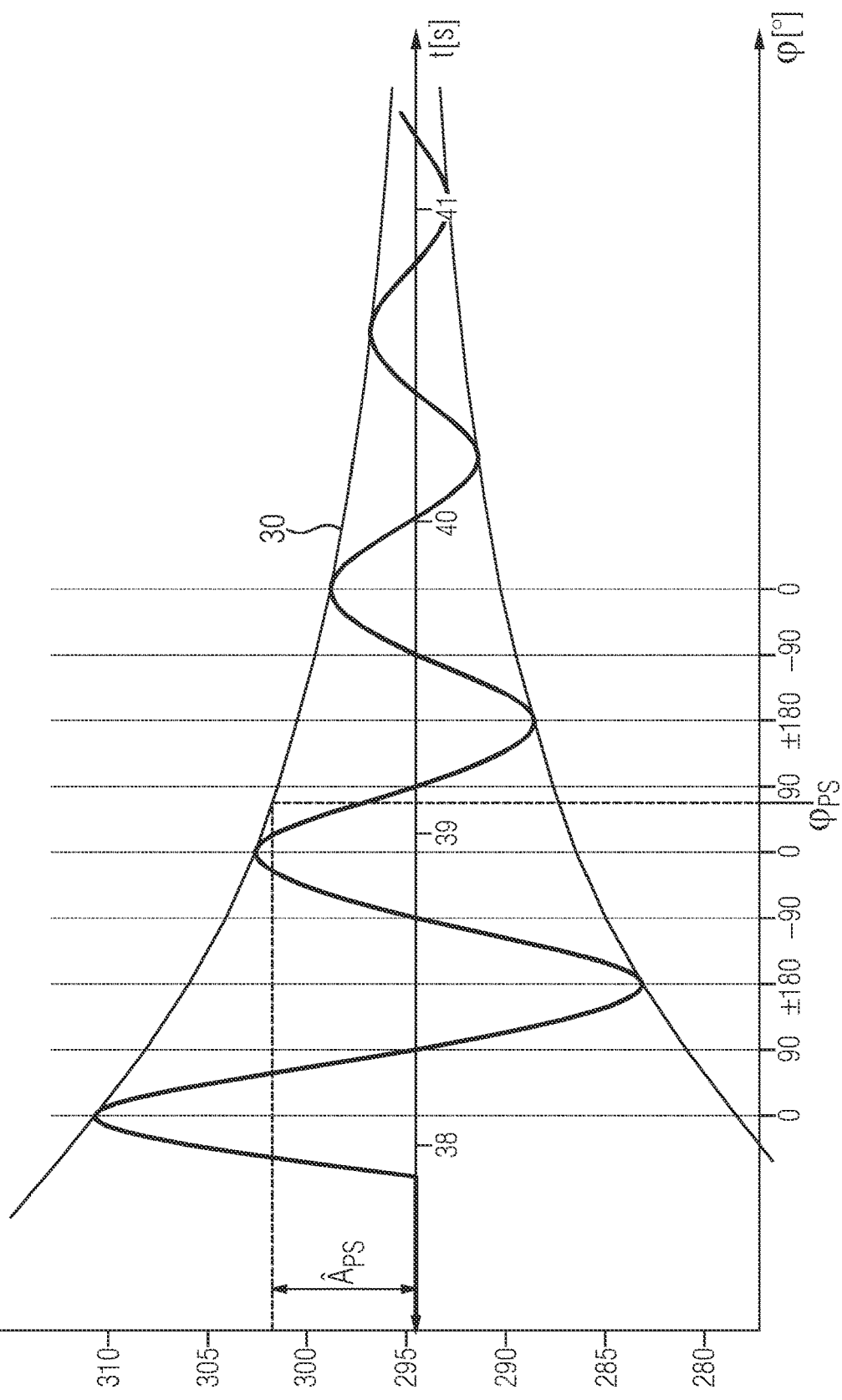
FIG. 3 is a graph showing a curve of a damped electrical oscillation.

To this end, FIG. 3 shows by way of example the curve of active power variables during a damped oscillation. In this case, enveloping curves represent the profile of the amplitude A of the oscillation and the damping of the oscillation can be determined from the change in the profile. Calculation methods for determining the parameters of "amplitude" and "damping" are known from European patent EP 2774242 B1 which was cited at the outset, the latter being explicitly referenced herewith.

By way of example, the calculated parameters can be displayed on the operator working station 17 for the operators of a power system control center. In this case, the parameters can be presented, for example, in the form of a table or in the form of a diagram. Moreover, it is alternatively or additionally also possible for the computing device 23 to be used to undertake, on the basis of the parameters, a risk assessment of an oscillation present and for the result of this risk assessment to be displayed on the operator working station. An example for determining a hazard characteristic is likewise known from European patent EP 2774242 B1.

Moreover, a warning signal can be generated by the computing device 23 if the parameters indicate a particularly dangerous oscillation, in particular a weakly damped or even increasing oscillation. This warning signal can likewise be output on the operator working station in order to give the operators the option of introducing suitable countermeasures. Alternatively, introduction of automatic countermeasures can also be envisaged. This is indicated schematically in FIG. 2 by a switch 24 that is connected to the device by way of a communications link. Automatic countermeasures can consist of connecting or disconnecting certain system parts, loads or generators. Moreover, mains filters and/or capacitive or inductive elements can be used to damp oscillations present and to stabilize the system.

Figure 4:
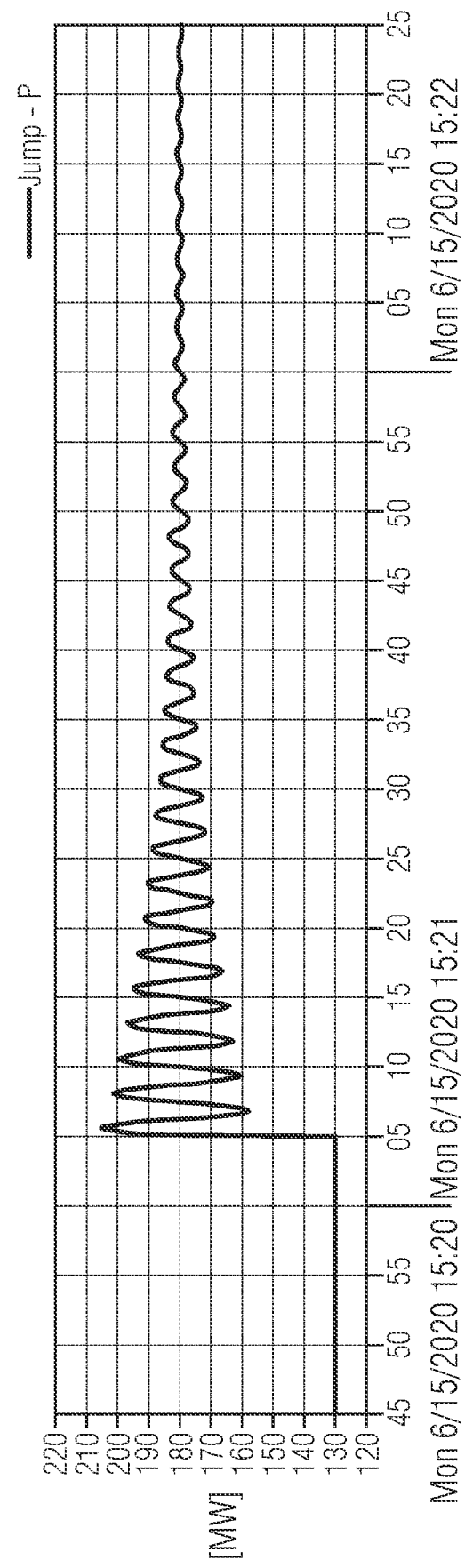
FIG. 4 is a graph showing a measured curve of active power values during an electrical oscillation.

Below, the calculation of the parameters on the basis of an adaptively adapted number of active power values is discussed. To this end, FIG. 4 shows an exemplary curve of active power values during an oscillation. By way of example, such an oscillation may arise on account of a sudden change in the power supply system, for example when disconnecting a single line of a double-circuit line.

If a constant number of values were taken without change for the purposes of calculating the parameters, for example by virtue of filling a fixed-length data buffer (also referred to as "buffer" below) with successive values of the electrical active power over time, incorrect parameters would arise at the start of an oscillation. Once the buffer has been completely filled, the values or data contained therein are transformed into the frequency domain, the frequencies characteristic for one or more oscillations are ascertained there and the associated amplitudes are determined. If the buffer is now updated with each new active power value, the damping of the oscillation can be ascertained going forward from the change in the amplitude. Consequently, the parameters of "amplitude" and "damping" are each calculated from a constant number of active power values. A disadvantage of this method is that at the start of an oscillation only a small part of the buffer is initially filled with data characteristic for the oscillation, and so for example a high amplitude of the oscillation at this time only leads to a small amplitude in the associated frequency spectrum.

In the case of a damped oscillation, the actual amplitude decays over time after the start of the oscillation; by contrast, the amplitude initially continues to increase in the calculated frequency spectrum on account of the continuously increasing proportion of the oscillation in the data buffer of the time domain and finally attains a maximum in the case of a damped oscillation when the buffer is for the first time entirely filled over its entire length with data of the oscillation. By contrast, the amplitude would continue to increase in the case of an undamped oscillation. Therefore, up until this time of the maximum, the evaluation of temporally successive amplitudes in the frequency spectrum for a given oscillation frequency gives as a result an undamped, increasing oscillation, connected with a possible and then incorrect alarm.

Expressed differently, there would initially be an incorrect calculation of the parameters if a constant number of values were to be used to calculate the parameters.

Figure 5:
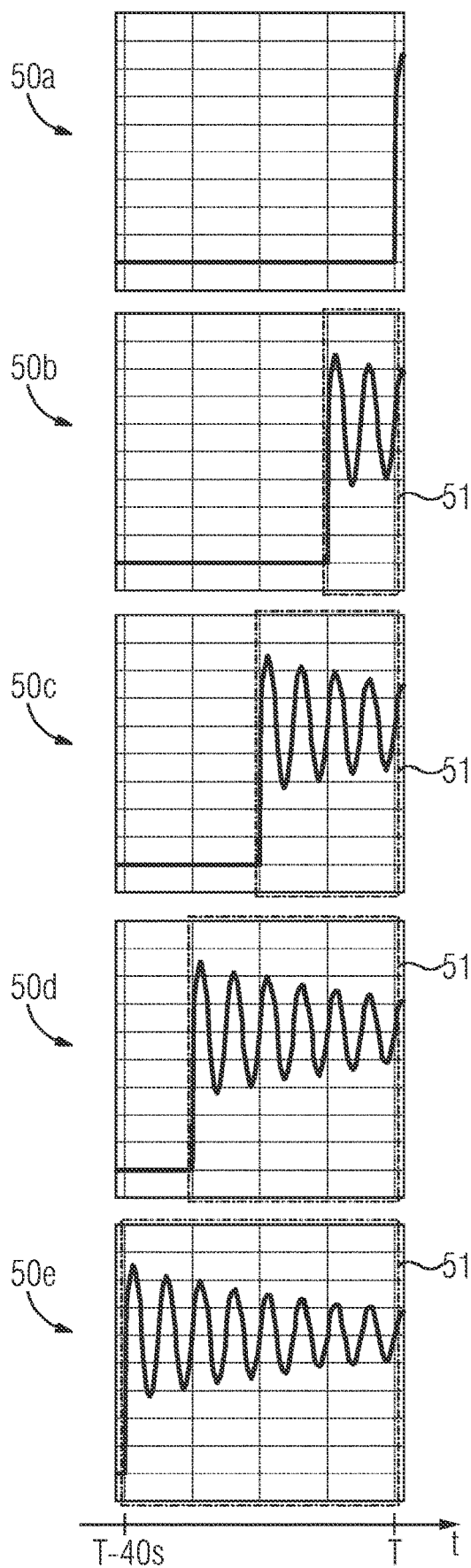
FIG. 5 shows a plurality of diagrams for explaining a dynamic selection of values for calculating parameters of an electrical oscillation.

FIG. 5 should be considered in this respect. The buffer whose one edge is at real time T and whose other edge corresponds to real time minus, e.g., 40 seconds (T−40 s) is evaluated regularly, e.g., at every full second. Hence, after only a few seconds following the start of an oscillation, the buffer contains both a high proportion of the signal of the previous state and the start of the oscillation itself (cf., e.g., diagram 50a in FIG. 5). The proportion of oscillation signals then increases from time step to time step (cf. diagrams 50b-d) because the data buffer is continuously filled with a greater number of active power values during the oscillation, which displace older active power values—not belonging to the oscillation. Computationally, this leads to an increasing amplitude (cf. curve 60 in FIG. 6) even though the amplitude of the oscillation is in fact decreasing (cf. diagram in FIG. 4). Hence, the damping of the oscillation is assessed as inadequate and the hazard level thereof is assessed as higher than should be. Finally, the data buffer is completely filled with active power values that were recorded during the oscillation (cf. diagram 50*e* in FIG. 5). Correct parameters can be calculated from this time on. This leads to a delay of several seconds, during which no measures or, in the worst case, even damaging measures could be introduced.

Using the procedure proposed in the present case, the data buffer does not have a fixed length in the time domain like in the above-described solution but is dynamically adapted to the actual length of the oscillation. This can be implemented either by dynamic control of the memory cells physically provided for storing the values or by placing a data window with a dynamic length. The alternative specified last is indicated in FIG. 5 by an appropriate data window 51 with a dynamic length. It is possible to recognize that the data window 51 used for selecting the values to be used for calculating the parameters adopts an increasing length in each diagram 50*b*-50*e* and thus adapts to the oscillation.

Here, the start of the buffer (left edge of the data window 51 in the diagrams in FIG. 5) is defined by the time of recognizing the oscillation. The recognition itself can be performed by, for example, a jump recognition, i.e., a sufficiently large increase in the active power within a specified, short period of time.

The values selected for calculating the parameters are subsequently transformed into the frequency domain. By way of example, the transformation is implemented by way of a Fast Fourier Transform (FFT). For the input data in the time domain, the latter requires a buffer with a length that corresponds to a number of temporally successive values according to a power of two. Hence, it may be advantageous to not continuously adapt the number of values selected for the calculation of the parameters but instead to carry out an adaptation in stages, preferably in powers of two in the case of the FFT.

Figure 6:
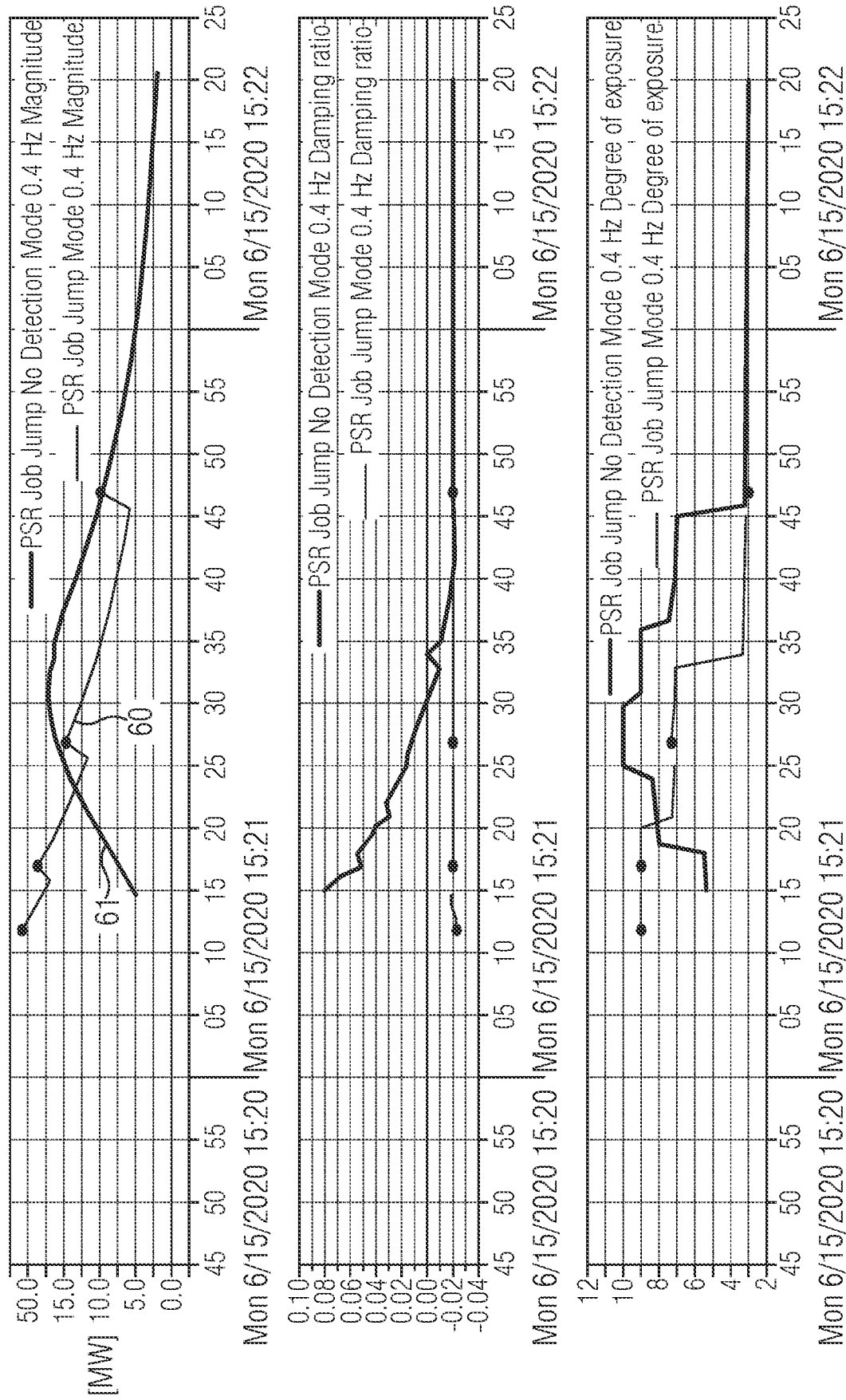
FIG. 6 shows a plurality of diagrams for explaining a calculation of parameters of an electrical oscillation.

In the case of such an incremental adjustment, the next higher step, e.g., the jump from $2^3$ to $2^4$, is only used when the number of those values which are actually influenced by the oscillation at least corresponds to this next higher step ($2^4$ in this case). Consequently, if the number of values in the time domain at different evaluation times following the recognition of the start of an oscillation does not yet correspond to the next higher step (e.g., $2^4$), only the most recent values corresponding to the current step (e.g., $2^3$) are subject to the further evaluation. Only once the number of values in the time domain has reached the next larger step (e.g., $2^4$) are these supplied in the totality thereof to the further evaluation. By way of curve 61, FIG. 6 shows a result of such a calculation of the "amplitude" parameter carried out in incremental fashion. The described procedure is carried out until a previously defined upper limit for the number of data items in the time domain to be evaluated has been reached. This should at least be chosen in such a way that, firstly, the oscillation with the highest oscillation frequency to be ascertained can be evaluated with a sufficient precision. Secondly, data regions further back in time should have as little influence as possible on the current results, which can be achieved by a correspondingly short buffer length. The last-mentioned demand avoids the case where, for example in the case of an oscillation that in fact decays quickly, the amplitude thereof tends to be overestimated for the subsequent times in the results of the evaluation on account of the comparatively high real initial value.

Furthermore, the data consisting of the values of the oscillation variable can be convolved with a suitable window function before being handed over to the FFT so that the data in the time domain can be continued periodically by repetition of the pattern in order to avoid artefacts, caused by jumps at the edges, in the frequency spectrum obtained by applying the FFT to the data in the time domain. To this end, the temporal length of such a window function is dynamically adapted to the length of the time domain of the data to be evaluated. By way of example, a Hanning window can be used as a window function.

Assuming a Gaussian distribution of the amplitudes around the oscillation frequency in the frequency spectrum evident following the FFT, it is proposed to form the logarithm of the amplitude distribution as a function of the frequency and subsequently ascertain the precise value of the oscillation frequency by way of a quadratic fit. Since at least three values must be available in the frequency spectrum to this end, a value of 8 ($2^3$) is proposed as the smallest number of available data items in the time domain.

When the next higher step for the number of active power values in the time domain is reached, the curve of the oscillation amplitude ascertained thus generally exhibits a jump (cf. curve 61 in FIG. 6). In this case, there tends to be an upward jump in the case of a decaying oscillation as a consequence of the comparatively larger amplitudes of the now considered values further back in time while there tends to be a downward jump in the case of an increasing oscillation on account of the now contributing smaller amplitude values. To gain knowledge of the cause, it is proposed to appropriately label the amplitude values for this time.

To obtain reliable data, it is furthermore proposed to utilize only that data which comprises a minimum duration of the associated oscillation. To this end, following recognition of a peak in the frequency spectrum characteristic for an oscillation, the associated frequency value is determined, for example by determining the maximum of the peak, and, from this, the associated number of oscillation periods contained in the input data of the FFT. Should this be less than the specified minimum number of periods of the oscillation, e.g., two, there is no further evaluation of the peak for this frequency at this time ("2 period criterion").

To ascertain the damping ratio, the difference of two successive amplitude values is considered in the simplest case. In the case of an actually decaying oscillation, there would be an increase in the amplitude in the evaluation and hence, incorrectly, a value of the damping characterizing an increasing oscillation at the time of reaching the next higher step on account of the preceding consideration. Together with a sufficiently high oscillation amplitude, this would result in a high value of risk potential for this oscillation going forward. To avoid this effect and, accompanying this, a possible alert, it is proposed to suppress the ascertainment of the damping ratio or, alternatively, label the value of damping ascertained thus invalid at a time where there is a switchover to the next step.

Thus, in summary, a Fast Fourier Transform (FFT) of the input signals (e.g., active power values) from the time domain to the frequency domain is carried out in the described exemplary embodiment for the purposes of detecting oscillations. For better detection, use is made of buffers or data windows of different lengths in order to obtain an optimum between timely detection and accuracy of the characteristic variables. If the absolute difference of two successive active power values is greater than a specified limit value, a jump is recognized and hence the edge of the evaluation range is set to the time of the jump so that only the time range of the oscillation in the buffer is evaluated.

To evaluate the buffer by the FFT, it is necessary to shorten the number of samples to a value $2^N$, where N={3, 4, 5, . . . }. To this end, if necessary, the left edge of the evaluation range is shifted further to the right ($2^N$ criterion).

By shifting the left edge of the evaluation buffer, the remaining buffer can be so small that an evaluation in the current time step is not possible without sufficient accuracy. The results of an FFT are then not processed further. In subsequent time steps, the evaluation range of the buffer is enlarged again, if necessary, as soon as the number of samples since the jump-like change is greater than $2^{(N+1)}$. This improves the accuracy of the results. This is implemented until the maximum buffer size (and hence maximum accuracy) is reached.

In the case of a decaying oscillation, an increase in the evaluation range of the buffer leads to an increase in the amplitude from one time step to the next (curve 61 in FIG. 6) since, in contrast to the preceding time step, more data from the initial time interval of the oscillation are now present in the evaluation range again. However, since this is determined by the algorithm, the result of the amplitude for the time when the evaluation range is increased is labeled with the quality information "unreliable". An assessment of the oscillation in respect of damping and hazard level is suppressed, alarms or events are not output.

To elucidate the described procedure, table 1 reproduces the dynamic buffer size for a field device, e.g., a PMU, with 50 measurement values per second during the evaluation of the oscillation that forms the basis of FIGS. 4 and 6. The column "Samples from the PMU" reproduces the number of samples with data about the oscillation; the column "Samples to the FFT" reproduces the number of samples that are transferred to the evaluation by the FFT. The period is 2.5 s.

| Time | Samples from the PMU | Samples to the FFT | Buffer length [s] | Comment |
|---|---|---|---|---|
| 15:21:05 | 0 | 0 | 0 | Start of the event |
| 15:21:06 | 50 | 32 | 0.64 | No event as per 2-period |
| 15:21:07 | 100 | 64 | 1.28 | criterion |
| 15:21:08 | 150 | 128 | 2.56 | |
| 15:21:09 | 200 | 128 | 2.56 | |
| 15:21:10 | 250 | 128 | 2.56 | |
| 15:21:11 | 300 | 256 | 5.12 | |
| 15:21:12 | 350 | 256 | 5.12 | Amplitude can be calculated but not the damping ratio and criticality. Therefore only the amplitude is output. |
| 15:21:16 | 550 | 512 | 10.24 | Lengthening of the buffer and consequently proportionally more oscillation data with a high amplitude, hence the amplitude increases and is labelled unreliable. Evaluation of damping and hence hazard level suspended. |
| 15:21:26 | 1050 | 1024 | 20.48 | Lengthening of the buffer, see also 15:21:16 |
| 15:21:46 | 2048 | 2048 | 40.96 | Lengthening of the buffer; see also 15:21:16; maximum buffer size reached |
| 15:22:21 | 2048 | 2048 | 40.96 | Amplitude drops below the detection threshold, no output of events, oscillating circuit is terminated |

FIG. 6 shows the comparison of the evaluation results for the parameters of "amplitude" and "damping", and the hazard level derived therefrom on the basis of the oscillation shown in FIG. 4 at an oscillation frequency of 0.4 Hz. Here, the results with and without the dynamic adaptation of the number of active power values selected for calculating the parameters are always represented next to one another. It is recognizable that after a time of t=15:21:46, the results are the same for both variants on account of the same number used and, accordingly, only the curves for the variant without jump recognition are visible.

Using the above-described procedure, it is possible to obtain timely information about the presence and type of an electrical oscillation in the electrical power supply system. This is achieved by a dynamic adaptation of the values used for the evaluation to the amount of available measurement data that was determined during the oscillation. Connected therewith, there can be a comparatively precise ascertainment of parameters for describing the oscillation already at an earlier time, for which only small amounts of data are available. This is of particular interest if manual or automatic switching measures are planned in the system on the basis of the results.

In summary, the method described therefore has, inter alia, the following advantages:
an oscillation is recognized earlier;
the amplitude of an oscillation is calculated correctly even at the start of the oscillation;
hence the damping is likewise correct from the start of the oscillation (negative instead of positive in the case of a damped oscillation); and
a hazard level of the oscillation can be correctly ascertained in timely fashion.

Although the invention has been illustrated and described in more detail above by preferred exemplary embodiments, the invention is not restricted by the disclosed examples and other variations may be derived therefrom by a person skilled in the art without departing from the scope of protection of the following patent claims.

The invention claimed is:

1. A method for recognizing an electrical oscillation in an electrical power supply system, which comprises the steps of:
   recognizing a start of the electrical oscillation;
   determining an electrical oscillation variable for at least one measuring point in the electrical power supply system;
   writing values of the electrical oscillation variable to a data buffer being operated as a circular buffer;
   calculating parameters of the electrical oscillation on a basis of a time curve of the electrical oscillation variable for the at least one measuring point, the values of the electrical oscillation variable, determined after the start of the electrical oscillation, are used to calculate the parameters of the electrical oscillation;
   adapting a number of successive values of the electrical oscillation variable from which the parameters of the electrical oscillation are calculated dynamically to a sequence of values of the electrical oscillation variable, wherein a length of a data window defining which of the values of the electrical oscillation variable contained in the data buffer are used to calculate the parameters is dynamically adapted to the sequence of values of the electrical oscillation variable;
   deducing a presence and type of the electrical oscillation using the parameters; and
   introducing a countermeasure into the electrical power supply system for damping the electrical oscillation if the electrical oscillation is determined to be an undamped electrical oscillation or having an increasing oscillation.

2. The method according to claim 1, wherein the electrical oscillation variable is electrical active power or a variable proportional to the electrical active power.

3. The method according to claim 1, which further comprises adapting dynamically a size of the data buffer to the sequence of values of the electrical oscillation variable.

4. The method according to claim 1, which further comprises transforming values of the electrical oscillation variable into a frequency domain for purposes of calculating the parameters.

5. The method according to claim 1, wherein a number of values of the electrical oscillation variable used to calculate the parameters corresponds to a power of two $2^N$.

6. The method according to claim 1, which further comprises calculating an amplitude and a damping of the electrical oscillation as the parameters of the electrical oscillation.

7. The method according to claim 1, which further comprises displaying the parameters on a display apparatus of a data processing device that monitors the electrical power supply system.

8. The method according to claim 1, which further comprises generating a warning signal in a case where the parameters calculated indicate an undamped electrical oscillation.

9. A device for recognizing an electrical oscillation in an electrical power supply system, the device comprising:
   a data buffer operating as a circular buffer; and
   a computer device set up to:
      recognize a start of the electrical oscillation;
      determine an electrical oscillation variable for at least one measuring point in the electrical power supply system;
      write values of the electrical oscillation variable to said data buffer;
      calculate parameters of the electrical oscillation on a basis of a time curve of the electrical oscillation variable for the at least one measuring point, the values of the electrical oscillation variable, determined after the start of the electrical oscillation, are used to calculate the parameters of the electrical oscillation;
      deduce a presence and type of the electrical oscillation using the parameters;
      dynamically adapt a number of successive values of the electrical oscillation variable from which the parameters of the electrical oscillation are calculated to a sequence of values of the electrical oscillation variable, wherein a length of a data window defining which of the values of the electrical oscillation variable contained in said data buffer are used to calculate the parameters is dynamically adapted to the sequence of values of the electrical oscillation variable; and
      introduce a countermeasure into the electrical power supply system for damping the electrical oscillation if the electrical oscillation is determined to be an undamped electrical oscillation or having an increasing oscillation.

10. A system for recognizing an electrical oscillation in an electrical power supply system, the system comprising:
   the device according to claim 9, wherein said device being embodied to determine the parameters of the electrical oscillation for at least two measuring points in the electrical power supply system.

* * * * *